United States Patent [19]
Jolivet

[11] Patent Number: 5,059,817
[45] Date of Patent: Oct. 22, 1991

[54] NARROW PULSE GENERATOR

[75] Inventor: André Jolivet, Versailles, France

[73] Assignee: Matra Communication, Quimper, France

[21] Appl. No.: 553,456

[22] Filed: Jul. 17, 1990

[30] Foreign Application Priority Data

Jul. 19, 1989 [FR] France ................. 8909703

[51] Int. Cl.$^5$ ................ H03K 3/017; H03K 5/04
[52] U.S. Cl. ................ 307/265; 307/266; 307/273
[58] Field of Search ............ 307/264, 265, 266, 261, 307/273, 288; 328/58

[56] References Cited

U.S. PATENT DOCUMENTS

| | | | |
|---|---|---|---|
| 3,009,069 | 11/1961 | Lee | 307/88.5 |
| 3,209,173 | 9/1965 | Rumble | 307/266 |
| 3,961,207 | 6/1976 | Minakuchi | 307/265 |
| 4,843,253 | 6/1989 | Poletto | 307/266 |

Primary Examiner—Stanley D. Miller
Assistant Examiner—Toan Tran
Attorney, Agent, or Firm—Griffin, Branigan & Butler

[57] ABSTRACT

A narrow pulse generator comprises a first transistor and a second transistor connected to a stabilized power supply via respective impedance-matching resistance. The first transistor has an input terminal connected to a source of signals having a series of voltage edge, an output terminal connected firstly to an inductance and secondly to a control terminal of the second transistor, and a control terminal connected to an input terminal of the second transistor. The second transistor has an output terminal connected to a load resistance and to an output terminal of the pulse generator.

1 Claim, 1 Drawing Sheet

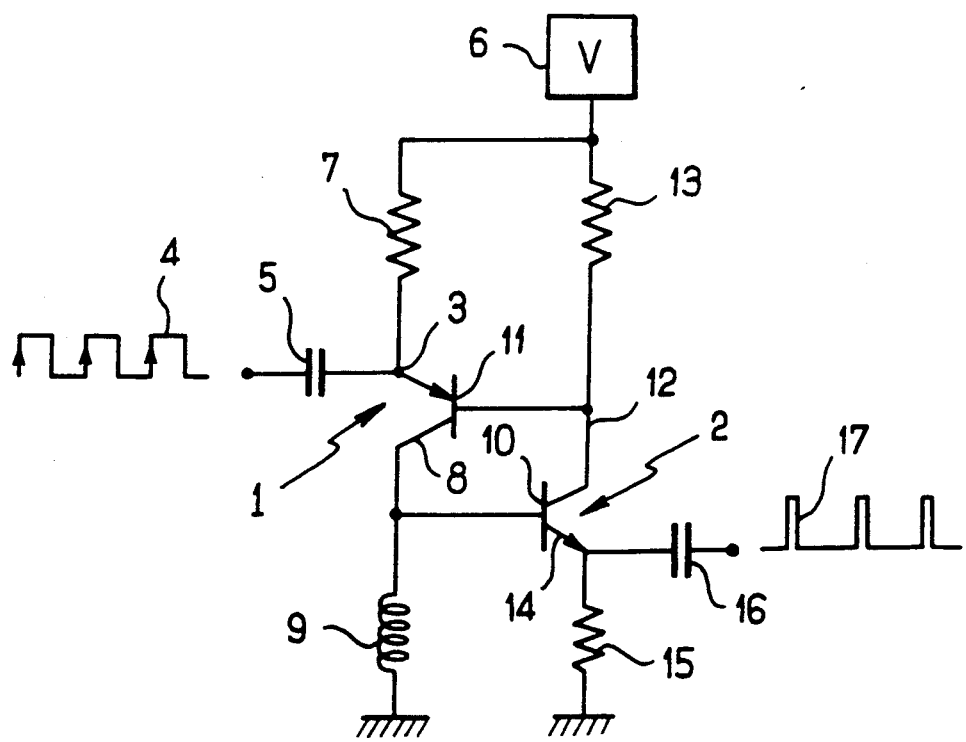

NARROW PULSE GENERATOR

The present invention relates to a generator of narrow pulses.

BACKGROUND OF THE INVENTION

In order to obtain a frequency spectrum, in particular for servo-controlling an oscillator for generating a local carrier wave in a radiocommunications system, it is necessary to generate narrow pulses, and the wider the desired spectrum, the narrower the pulses must be. Narrow pulses can be generated from a periodic signal by means of a circuit including a diode. However, diodes suitable for generating narrow pulses from a periodic signal are expensive components and the continuing expansion of radiocommunications systems makes it advantageous to find cheaper devices that are suitable for wider dissemination.

An object of the invention is to provide a narrow pulse generator which is very cheap.

SUMMARY OF THE INVENTION

In order to achieve this object, the present invention provides a narrow pulse generator comprising a first transistor and a second transistor connected to a stabilized power supply via respective impedance-matching resistances, the first transistor having an input terminal connected to a source of signals including a series of voltage edges, an output terminal connected firstly to an inductance and secondly to a control terminal of the second transistor, and a control terminal connected to an input terminal of the second transistor, the second transistor additionally including an output terminal connected to a load resistance and to an output terminal of the pulse generator.

Thus, given the very low cost of transistors which are presently manufactured in very large quantities, the overall cost of the generator is very low compared to that of generators including a diode for generating pulses.

BRIEF DESCRIPTION OF THE DRAWING

An embodiment of the invention is described by way of example with reference to the accompanying drawing, in which the sole figure is a circuit diagram of a pulse generator of the invention.

DETAILED DESCRIPTION

The narrow pulse generator of the invention comprises a first transistor given an overall reference 1 and a second transistor given an overall reference 2. In the embodiment shown, the first transistor 1 is a PNP transistor while the second transistor is an NPN transistor. The emitter 3 of the first transistor is connected firstly to a source of squarewave signals 4 via a blocking capacitor 5, and secondly to a stabilized power supply 6 delivering a positive DC voltage V via an impedance matching resistor 7.

The collector 8 of the first transistor is connected to ground via an inductor 9 and also to the base 10 of the second transistor. The base 11 of the first transistor is connected to the collector 12 of the second transistor, said collector 12 itself being connected to the stabilized power supply 6 via an impedance matching resistor 13. The emitter 14 of the second transistor is connected firstly to ground via a load resistor 15 and secondly to the output of the pulse generator via a blocking capacitor 16 so as to produce narrow pulse 17.

Thus, in the first transistor 1, the emitter 3, the collector 8, and the base 11 respectively constitute an input terminal, an output terminal, and a control terminal, whereas in the second transistor 2, the collector 12, the emitter 14, and the base 10 respectively constitute an input terminal, an output terminal, and a control terminal for the second transistor.

The pulse generator of the invention operates as follows. When the generator is powered solely by the power supply voltage, both transistors are off and no current flows through the generator. The same applies when the input terminal 3 of the first transistor is subjected to a falling edge or to a level voltage in the squarewave signal 4. When a rising edge in the squarewave signal 4 reaches the input terminal 3 of the first transistor, the first transistor begins to conduct and increasing current flows through the first transistor from its emitter 3 to its collector 8. By virtue of the inductor 9, a voltage appears at the output terminal 8 of said first transistor which is proportional to the derivative of the current flowing through the first transistor, thereby causing the second transistor to conduct in turn. Because of the loop formed by the first and second transistors, both transistors conduct more and more until the transistor 1 is saturated. The voltage representative of the derivative of the current at the output terminal 8 of the first transistor then disappears, causing the second transistor to switch off. Simultaneously, since the rising edge of the squarewave signal 4 is no longer present at the input terminal 3 of the first transistor, it too switches off in turn and the generator returns to its rest position waiting for the following rising edge in the squarewave signal 4.

It may thus be observed that each time the transistor 2 conductor, a signal is obtained at the output terminal 14 of the second transistor. Because of the very high speed of the avalanche phenomenon which takes the first transistor to saturation once the second transistor begins to conduct, the output voltage from the second transistor appears in the form of narrow pulses 17 at the same period as the rising edges in the squarewave signal 4.

Naturally the invention is not limited to the embodiment described and variants may be applied thereto without going beyond the scope of the invention. In particular, although the invention has been described with a PNP type first transistor and an NPN type second transistor associated with a positive voltage DC power supply, the generator of the invention could also be provided using other types of transistor and adapting the circuit appropriately so that the first and second transistors constitute a closed loop in which the product of the two gains is positive, with the inductance being disposed in said loop to ensure that the second transistor is held off so long as the first transistor is not conducting and as soon as it reaches saturation.

What is claimed is:

1. A narrow pulse generator comprising a first transistor and a second transistor connected to a stabilized power supply through respective impedance-matching resistances, the first transistor having an input terminal connected to a source of signals including a series of voltage edges, an output terminal connected firstly to an inductance and secondly to a control terminal of the second transistor, and a control terminal connected to an input terminal of the second transistor, the second transistor additionally including an output terminal connected to a ground through a load resistance and to an output terminal of the pulse generator.

* * * * *